(12) United States Patent
Hosey et al.

(10) Patent No.: US 9,393,920 B2
(45) Date of Patent: Jul. 19, 2016

(54) TELEMATICS-BASED SYSTEM FOR PROTECTING AGAINST VEHICLE BATTERY DRAIN

(71) Applicant: General Motors LLC, Detroit, MI (US)

(72) Inventors: Eric T. Hosey, Rochester, MI (US); Kevin W. Owens, Sterling Heights, MI (US); Joshua M. Sine, Beverly Hills, MI (US); Daniel C. McGarry, Oxford, MI (US)

(73) Assignee: General Motors LLC, Detroit, MI (US)

( * ) Notice: Subject to any disclaimer, the term of this patent is extended or adjusted under 35 U.S.C. 154(b) by 482 days.

(21) Appl. No.: 13/897,631

(22) Filed: May 20, 2013

(65) Prior Publication Data
US 2014/0343831 A1 Nov. 20, 2014

(51) Int. Cl.
| | | |
|---|---|---|
| *B60R 16/03* | (2006.01) | |
| *F02N 11/08* | (2006.01) | |
| *H04Q 9/00* | (2006.01) | |
| *H02J 7/00* | (2006.01) | |
| *H02J 9/00* | (2006.01) | |

(Continued)

(52) U.S. Cl.
CPC .......... *B60R 16/03* (2013.01); *F02N 11/0807* (2013.01); *H02J 7/0032* (2013.01); *H02J 9/002* (2013.01); *H04Q 9/00* (2013.01); *F02N 19/00* (2013.01); *F02N 2200/061* (2013.01); *F02N 2200/063* (2013.01); *F02N 2200/0809* (2013.01); *F02N 2250/02* (2013.01); *F02N 2300/2006* (2013.01); *G01R 31/3606* (2013.01); *G01R 31/3689* (2013.01); *H02J 2007/004* (2013.01); *H04Q 2209/823* (2013.01)

(58) Field of Classification Search
CPC ... Y02T 10/7005; Y02T 90/16; Y02T 90/128; Y02T 90/14; Y02T 90/163; Y02T 90/168; Y02T 10/7044; B60L 3/12; B60L 11/1861; B60L 11/1851; B60L 2240/62; B60L 2240/625; B60L 2250/10; B60L 2250/12; B60L 2250/16; F02N 11/0807; F02N 2200/061; F02N 11/0811
USPC .......... 701/2, 22, 113, 33.4; 340/426.13, 438, 340/455, 989; 370/346, 349
See application file for complete search history.

(56) References Cited

U.S. PATENT DOCUMENTS

| | | | | |
|---|---|---|---|---|
| 5,200,688 | A * | 4/1993 | Patino | H02J 7/0031 307/10.7 |
| 5,397,991 | A * | 3/1995 | Rogers | B60L 11/1861 320/125 |
| 5,602,459 | A * | 2/1997 | Rogers | B60L 11/1861 320/134 |

(Continued)

*Primary Examiner* — Hung Q Nguyen
*Assistant Examiner* — John Bailey
(74) *Attorney, Agent, or Firm* — Leydig, Voit & Mayer, Ltd.

(57) ABSTRACT

Systems and methods are provided for detecting low vehicle battery charge and responding appropriately to prevent complete vehicle battery drainage. One method includes: monitoring the charge of the vehicle battery; determining, by a telematics unit, that the charge of the vehicle battery has reached a low battery charge threshold while the vehicle engine is off; and providing, by the telematics unit, a notification to a telematics subscriber that the vehicle battery has low charge. Another method includes: monitoring the charge of the vehicle battery; determining, by a telematics unit, that the charge of the vehicle battery has reached a low battery charge threshold while the vehicle engine is off; and in response to determining that the low battery charge threshold has been reached, disabling at least one load draining the vehicle battery.

12 Claims, 4 Drawing Sheets

(51) Int. Cl.
*F02N 19/00* (2010.01)
*G01R 31/36* (2006.01)

(56) References Cited

U.S. PATENT DOCUMENTS

| | | | | |
|---|---|---|---|---|
| 7,149,530 B1* | 12/2006 | Arakawa | G08C 17/02 | 340/315 |
| 7,283,810 B1* | 10/2007 | Arakawa | G08C 17/02 | 340/438 |
| 7,596,366 B2* | 9/2009 | Van Bosch | H04W 52/0216 | 340/7.33 |
| 8,509,988 B2* | 8/2013 | Uyeki | B60L 3/12 | 701/22 |
| 8,615,343 B2* | 12/2013 | Aldighieri | B60R 16/02 | 701/22 |
| 8,751,062 B2* | 6/2014 | Van Wiemeersch | B60R 16/033 | 701/113 |
| 8,831,808 B2* | 9/2014 | Stanek | H02J 7/0047 | 180/65.1 |
| 8,831,816 B2* | 9/2014 | Kwon | G06F 17/00 | 180/65.29 |
| 8,924,043 B2* | 12/2014 | Maslyn | H01M 10/44 | 701/2 |
| 2003/0016022 A1* | 1/2003 | Ziegler | H01M 10/48 | 324/426 |
| 2003/0052649 A1* | 3/2003 | Landgraf | H02J 7/14 | 320/135 |
| 2003/0158640 A1* | 8/2003 | Pillar | A62C 27/00 | 701/29.4 |
| 2004/0133319 A1* | 7/2004 | Pillar | A62C 27/00 | 701/31.4 |
| 2005/0182536 A1* | 8/2005 | Doyle | H02J 7/14 | 701/31.4 |
| 2006/0080007 A1* | 4/2006 | Gerard | F02N 11/0811 | 701/2 |
| 2006/0247833 A1* | 11/2006 | Malhotra | G07C 5/0841 | 701/31.4 |
| 2006/0253237 A1* | 11/2006 | Dannenberg | F02D 31/001 | 701/36 |
| 2007/0016347 A1* | 1/2007 | Yoshida | G05B 19/0425 | 701/36 |
| 2008/0059030 A1* | 3/2008 | Quigley | A62C 27/00 | 701/50 |
| 2009/0184686 A1* | 7/2009 | Owens, Jr. | H02J 7/0031 | 320/136 |
| 2010/0030431 A1* | 2/2010 | Potter | B60R 16/03 | 701/45 |
| 2010/0072290 A1* | 3/2010 | Dage | B60H 1/00657 | 236/51 |
| 2010/0256897 A1* | 10/2010 | Takata | B60R 25/04 | 701/113 |
| 2011/0082621 A1* | 4/2011 | Berkobin | B60L 11/1824 | 701/31.4 |
| 2011/0163718 A1* | 7/2011 | Van Wiemeersch | B60R 16/033 | 320/109 |
| 2011/0178654 A1* | 7/2011 | Bauerle | H01M 10/42 | 701/2 |
| 2011/0181106 A1* | 7/2011 | Kim | H04W 52/0277 | 307/9.1 |
| 2011/0278920 A1* | 11/2011 | Sakamoto | B60L 1/00 | 307/10.1 |
| 2012/0123670 A1* | 5/2012 | Uyeki | B60L 11/1838 | 701/300 |
| 2012/0309455 A1* | 12/2012 | Klose | B60L 11/1838 | 455/557 |
| 2013/0231848 A1* | 9/2013 | Roberts | F02N 11/0807 | 701/112 |
| 2013/0268139 A1* | 10/2013 | Endo | F02N 11/0807 | 701/2 |
| 2013/0271076 A1* | 10/2013 | Gregg | B60L 11/1838 | 320/109 |
| 2014/0039740 A1* | 2/2014 | Kwon | G06F 17/00 | 701/22 |

* cited by examiner

TELEMATICS-BASED SYSTEM FOR PROTECTING AGAINST VEHICLE BATTERY DRAIN

FIELD

The present disclosure relates generally to telematics systems and more particularly to preventing complete drain of a vehicle battery.

BACKGROUND

Telematics units within vehicles provide subscribers with connectivity to a telematics service provider (TSP). The TSP provides subscribers with an array of services ranging from emergency call handling and stolen vehicle recovery to diagnostics monitoring, global navigation system aided position identification, map services, and turn-by-turn navigation assistance. Telematics units are often provisioned and activated at a point of sale when a subscriber purchases a telematics-equipped vehicle. Upon activation, the telematics unit can be utilized to provide a subscriber with telematics services such as those described herein.

When the vehicle engine is off, for example when a user places the vehicle into an ignition-off mode or an accessory mode, the vehicle battery is still drained by certain vehicle-related operations. For example, in accessory mode, the user can still use infotainment services such as looking at navigation maps or listening to music. Even when the vehicle is in ignition-off mode, the vehicle can be in a powered-down discontinuous-reception (DRx) or standby state (also called a sleep cycle), where a network access device (NAD) of the vehicle still drains the vehicle battery while searching for signal or waiting for a command.

With conventional vehicles, a user does not know the battery charge state of the vehicle while the vehicle is accessory mode or ignition-off mode, and oftentimes users will unnecessarily keep their vehicle engines running out of concern that their usage of telematics-related services or other vehicle functionality will completely drain the battery. Other users may have a problem where they leave their engines off for too long while the vehicle's battery is drained in the accessory mode or the ignition-off mode, and end up in a situation where they cannot start their vehicles due to lack of battery charge. Still other users may inadvertently leave certain vehicle components running (e.g., leaving the lights on) and accidentally drain the vehicle battery while the vehicle is in the accessory mode or the ignition-off mode.

The above body of information is provided for the convenience of the reader. The foregoing describes a suitable environment for which the described system and method are provided, and is not an attempt to review or catalog the prior art.

SUMMARY

Implementations of the present invention provide systems and methods for detecting low vehicle battery charge and responding appropriately to prevent complete vehicle battery drainage. In one implementation, a method is provided for preventing discharge of a vehicle battery of a telematics-equipped vehicle. The method includes: monitoring the charge of the vehicle battery; determining, by a telematics unit, that the charge of the vehicle battery has reached a low battery charge threshold while the vehicle engine is off; and providing, by the telematics unit, a notification to a telematics subscriber that the vehicle battery has low charge. Further implementations include disabling loads from the vehicle battery in response to the determination that the charge of the vehicle battery has reached the low battery charge threshold.

BRIEF DESCRIPTION OF THE SEVERAL VIEWS OF THE DRAWINGS

While the appended claims set forth the features of the present invention with particularity, the invention, together with its objects and advantages, may be best understood from the following detailed description taken in conjunction with the accompanying drawings of which:

DETAILED DESCRIPTION

Before discussing the details of the invention and the environment wherein the invention may be used, a brief overview is given to guide the reader. In general terms, not intended to limit the claims, systems and methods are described herein for detecting low charge on a vehicle battery while the vehicle engine is off and for preventing further battery drain. When low charge is detected, a user is notified of the low charge, some or all loads connected to the battery are disabled or disconnected, the engine is automatically turned on, or some combination of the foregoing is performed so as to avoid a situation in which the vehicle battery is completely drained and the vehicle is incapable of being started.

Figure 1:
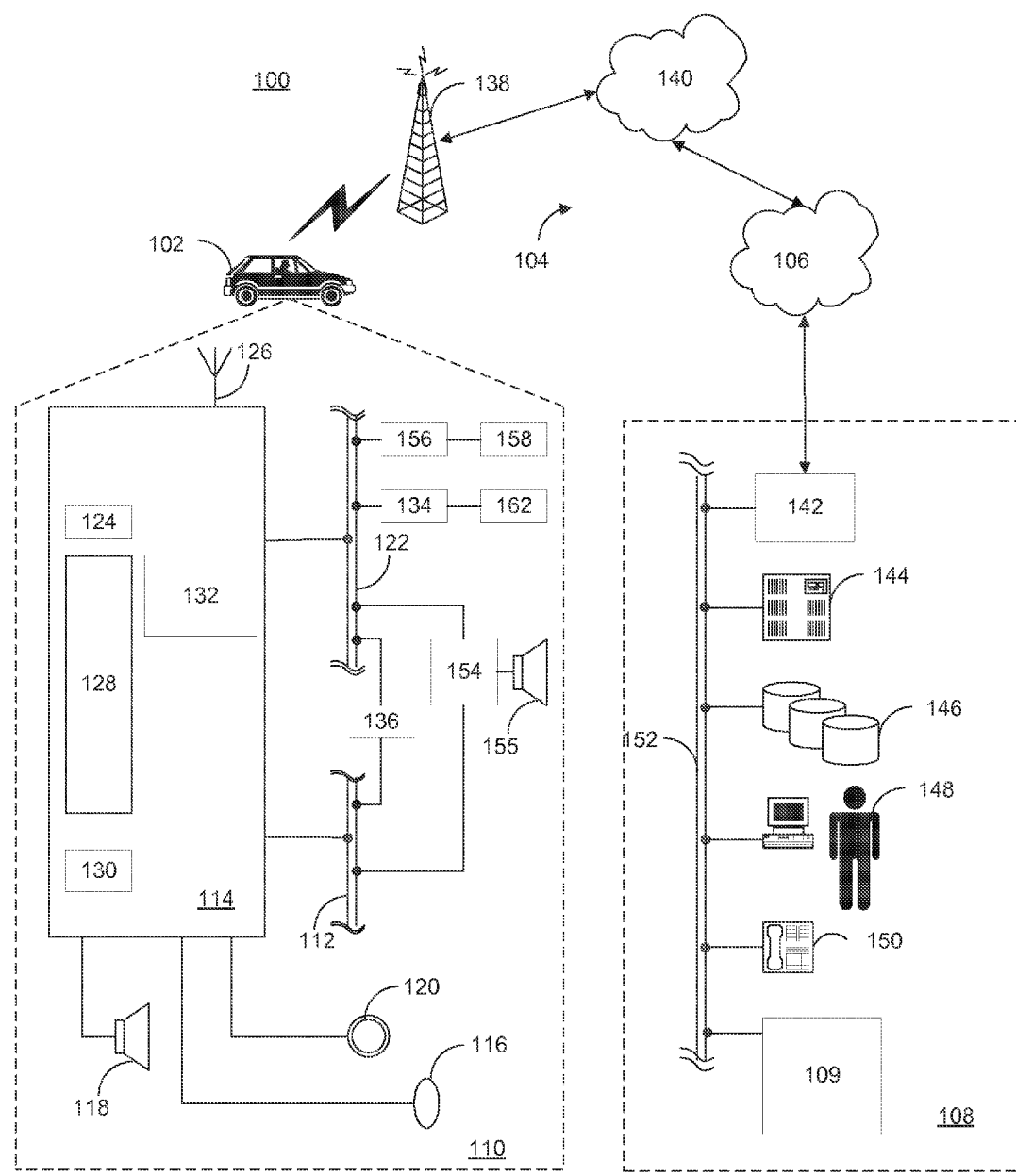
FIG. 1 is a schematic diagram of an operating environment for a mobile vehicle communication system usable in implementations of the described principles.

An exemplary computing and network communications environment is described hereinafter. It will be appreciated that the described environment is an example, and does not imply any limitation regarding the use of other environments to practice the invention. With reference to FIG. 1 there is shown an example of a communication system 100 that may be used with the present method and system and generally includes a vehicle 102, a mobile wireless network system 104, a land network 106 and a communications center 108. It should be appreciated that the overall architecture, setup and operation, as well as the individual components of the communication system 100 is generally known in the art. In accordance with an illustrative example, the communication center 108 includes a GNSS control center 109 incorporating functional components facilitating over-the-air configuration of GNSS receivers integrated with/within telematics units such as a telematics unit 114. Thus, the following paragraphs provide a brief overview of an exemplary communication system 100. However, other systems are also contemplated that are capable of incorporating the components and functionality described herein.

The vehicle 102 is, for example, a motorcycle, a car, a truck, a recreational vehicle (RV), a boat, a plane, etc. The vehicle 102 is equipped with suitable hardware and software that configures/adapts the vehicle 102 to facilitate communications with the communications center 108 via mobile wireless communications. The vehicle 102 includes hardware 110 such as, for example, the telematics unit 114, a microphone 116, a speaker 118 and buttons and/or controls 120 integrated with the telematics unit 114.

The telematics unit 114 is communicatively coupled, via a hard wire connection and/or a wireless connection, to a vehicle bus 122 for supporting communications between electronic components within the vehicle 102, including the vehicle battery. The vehicle battery is connected to or includes a charge monitor that detects the level of charge or health of the vehicle battery (e.g., according to voltage, life and/or usage of the battery) and communicates that information through the vehicle bus to other vehicle components (such as a battery charge controller) and/or the telematics unit. Examples of suitable network technologies for implementing the vehicle bus 122 in-vehicle network include a controller area network (CAN), a media oriented system transfer (MOST), a local interconnection network (LIN), an Ethernet, and other appropriate connections such as those that conform with known ISO, SAE, and IEEE standards and specifications.

The telematics unit 114 provides a variety of services through communications with the communications center 108. The telematics unit 114 includes an electronic processor 128, electronic memory 130, a mobile wireless component 124 including a mobile wireless chipset, a dual function antenna 126 (both GNSS and mobile wireless signal), and a GNSS component 132 including a GNSS chipset. In one example, the mobile wireless component 124 comprises an electronic memory storing a computer program and/or set of computer-executable instruction sets/routines that are transferred to, and executed by, the processing device 128. The mobile wireless component 124 constitutes a network access device (NAD) component of the telematics unit 114.

The telematics unit 114 provides, for users, an extensive/extensible set of services. Examples of such services include: GNSS-based mapping/location identification, turn-by-turn directions and other navigation-related services provided in conjunction with the GNSS component 132; and airbag deployment notification and other emergency or roadside assistance-related services provided in connection with various crash and or collision sensor interface modules 156 and crash sensors 158 located throughout the vehicle.

GNSS navigation services are, for example, implemented based on the geographic position information of the vehicle provided by the GNSS component 132. A user of the telematics unit 114 enters a destination, for example, using inputs associated with the GNSS component 132, and a route to a destination may be calculated based on the destination address and a current position of the vehicle determined at approximately the time of route calculation. Turn-by-turn (TBT) directions may further be provided on a display screen corresponding to the GNSS component and/or through vocal directions provided through a vehicle audio component 154. It will be appreciated that the calculation-related processing may occur at the telematics unit or may occur at a communications center 108.

The telematics unit 114 also supports infotainment-related services whereby music, Web pages, movies, television programs, video games and/or other content is downloaded by an infotainment center 136 operatively connected to the telematics unit 114 via the vehicle bus 122 and an audio bus 112. In one example, downloaded content is stored for current or later playback.

The above-listed services are by no means an exhaustive list of the current and potential capabilities of the telematics unit 114, as should be appreciated by those skilled in the art. The above examples are merely a small subset of the services that the telematics unit 114 is capable of offering to users. Moreover, the telematics unit 114 includes a number of known components in addition to those listed above that have been excluded since they are not necessary to understanding the functionality discussed herein below.

Vehicle communications use radio transmissions to establish a communications channel with the mobile wireless network system 104 so that both voice and data signals can be sent and received via the communications channel. The mobile wireless component 124 enables both voice and data communications via the mobile wireless network system 104. The mobile wireless component 124 applies encoding and/or modulation functions to convert voice and/or digital data into a signal transmitted via the dual function antenna 126. Any suitable encoding or modulation technique that provides an acceptable data rate and bit error can be used. The dual function antenna 126 handles signals for both the mobile wireless component 124 and the GNSS component.

The microphone 116 provides the driver or other vehicle occupant with a means for inputting verbal or other auditory commands, and can be equipped with an embedded voice processing unit utilizing a human/machine interface (HMI) technology known in the art. The speaker 118 provides verbal output to the vehicle occupants and can be either a stand-alone speaker specifically dedicated for use with the telematics unit 114 or can be part of an audio component 154. In either case, the microphone 116 and the speaker 118 enable the hardware 110 and the communications center 108 to communicate with occupants of the vehicle 102 through audible speech.

The hardware 110 also includes the buttons and/or controls 120 for enabling a vehicle occupant to activate or engage one or more components of the hardware 110 within the vehicle 102. For example, one of the buttons and/or controls 120 can be an electronic push button used to initiate voice communication with the communications center 108 (whether it be live advisors 148 or an automated call response system). In another example, one of the buttons and/or controls 120 initiates/activates emergency services supported/facilitated by the telematics unit 114.

The audio component 154 is operatively connected to the vehicle bus 122 and the audio bus 112. The audio component 154 receives analog information via the audio bus, and renders the received analog information as sound. The audio component 154 receives digital information via the vehicle bus 122. The audio component 154 provides AM and FM radio, CD, DVD, and multimedia functionality independent of the infotainment center 136. The audio component 154 may contain a speaker system 155, or may utilize the speaker 118 via arbitration on the vehicle bus 122 and/or the audio bus 112.

The vehicle crash and/or collision detection sensor interface 156 is operatively connected to the vehicle bus 122. The crash sensors 158 provide information to the telematics unit 114 via the crash and/or collision detection sensor interface 156 regarding the severity of a vehicle collision, such as the angle of impact and the amount of force sustained.

A set of vehicle sensors 162, connected to various ones of a set of sensor interface modules 134 are operatively connected to the vehicle bus 122. Examples of the vehicle sensors 162 include but are not limited to gyroscopes, accelerometers, magnetometers, emission detection and/or control sensors, and the like. Examples of the sensor interface modules 134 include ones for power train control, climate control, and body control.

The mobile wireless network system 104 is, for example, a cellular telephone network system or any other suitable wireless system that transmits signals between mobile wireless devices, such as the telematics unit 114 of the vehicle 102, and land networks, such as the land network 106. In the illustrative example, the mobile wireless network system 104 includes a set of cell towers 138, as well as base stations and/or mobile switching centers (MSCs) 140, as well as other networking components facilitating/supporting communications between the mobile wireless network system 104 with the land network 106. For example, the MSC 140 includes a remote data server.

As appreciated by those skilled in the art, the mobile wireless network system includes various cell tower/base station/MSC arrangements. For example, a base station and a cell tower could be co-located at the same site or they could be remotely located, and a single base station could be coupled to various cell towers or various base stations could be coupled with a single MSC, to name but a few of the possible arrangements.

Land network 106 can be, for example, a conventional land-based telecommunications network connected to one or more landline end node devices (e.g., telephones) and connects the mobile wireless network system 104 to the communications center 108. For example, land network 106 includes a public switched telephone network (PSTN) and/or an Internet protocol (IP) network, as is appreciated by those skilled in the art. Of course, one or more segments of the land network 106 can be implemented in the form of a standard wired network, a fiber or other optical network, a cable network, other wireless networks such as wireless local networks (WLANs) or networks providing broadband wireless access (BWA), or any combination thereof.

The communications center 108 is configured to provide a variety of back-end services and application functionality to the hardware 110. The communications center 108 includes, by way of example, network switches 142, servers 144, databases 146, live advisors 148, as well as a variety of other telecommunications equipment 150 (including modems) and computer/communications equipment known to those skilled in the art. These various call center components are, for example, coupled to one another via a network link 152 (e.g., a physical local area network bus and/or a wireless local network, etc.). Switch 142, which can be a private branch exchange (PBX) switch, routes incoming signals so that voice transmissions are, in general, sent to either the live advisors 148 or an automated response system, and data transmissions are passed on to a modem or other component of the telecommunications equipment 150 for processing (e.g., demodulation and further signal processing).

The telecommunications equipment 150 includes, for example, an encoder, and can be communicatively connected to various devices such as the servers 144 and the databases 146. For example, the databases 146 comprise computer hardware and stored programs configured to store subscriber profile records, subscriber behavioral patterns, and other pertinent subscriber information. Although the illustrated example has been described as it would be used in conjunction with a manned version of the communications center 108, it will be appreciated that the communications center 108 can be any of a variety of suitable central or remote facilities, which are manned/unmanned and mobile/fixed facilities, to or from which it is desirable to exchange voice and data.

It will be appreciated by those of skill in the art that the execution of the various machine-implemented processes and steps described herein may occur via the computerized execution of computer-executable instructions stored on a tangible computer-readable medium, e.g., RAM, ROM, PROM, volatile, nonvolatile, or other electronic memory mechanism. Thus, for example, the operations performed by the telematics unit may be carried out according to stored instructions or applications installed on the telematics unit, and operations performed at the call center may be carried out according to stored instructions or applications installed at the call center.

Figure 2:
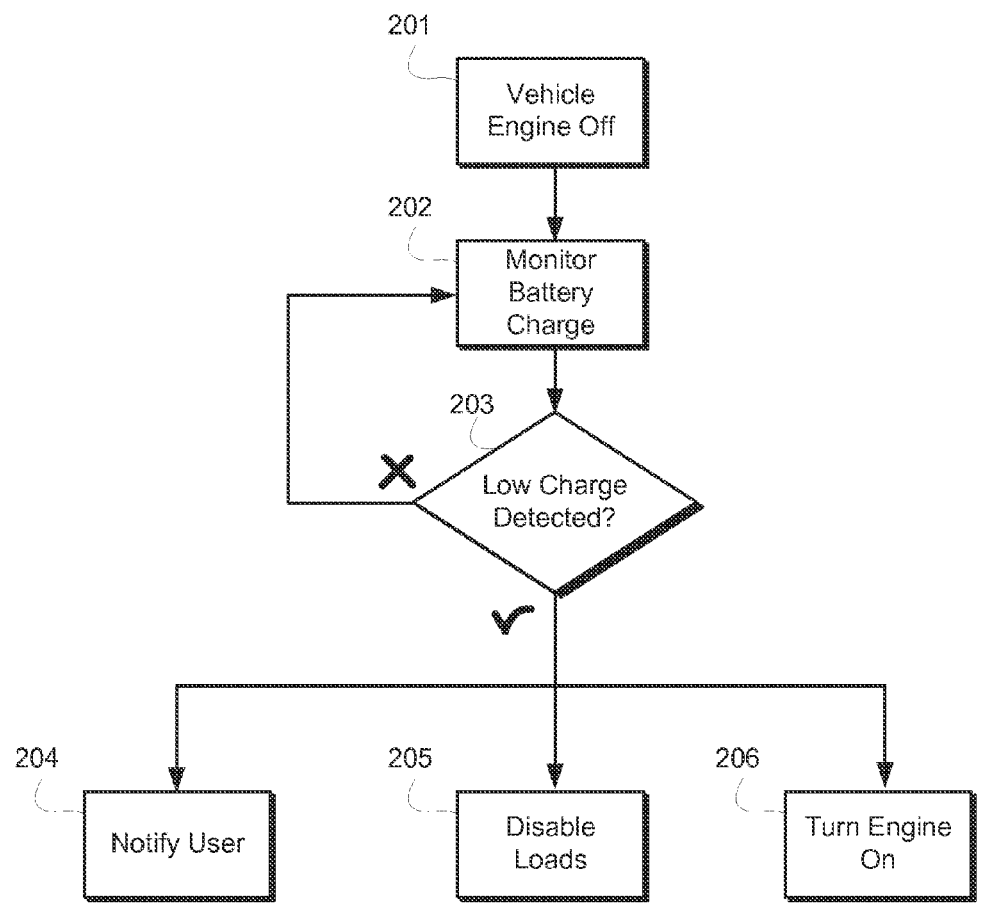
FIG. 2 is a flowchart illustrating processes for preventing complete drain of a vehicle battery according to implementations of the present invention.

With further reference to the architecture of FIG. 1, and turning more specifically to FIG. 2, a process 200 is depicted for preventing complete battery drain according to multiple exemplary implementations of the present invention. At stage 201, the vehicle engine is turned off and the vehicle is in an accessory mode or an off mode. While the engine is off, the battery charge of the vehicle battery is monitored at stage 202. Battery charge monitoring may be performed periodically or continuously based on the design of the battery charge monitoring component and/or based on the circumstances. If low charge is not detected at stage 203, the charge of the vehicle battery continues to be monitored at stage 202. If low charge is detected at stage 203, the telematics unit of the vehicle performs at least one of notifying a user of the low charge at stage 204, disabling (e.g., disconnecting or turning off) some or all loads at stage 205, or turning the engine on at stage 206. For example, in one implementation, the telematics unit only notifies the user at stage 204 and provides a recommendation to turn the engine on or disable some or all loads, and it is up to the user to decide whether to perform such actions. In a further implementation, the telematics unit provides the user with the option to disable loads and/or start the vehicle engine through the vehicle HMI or through the user's mobile phone (e.g., by responding to a text message, by using a keypad response to an automated phone call, or through a mobile application), such that the user may conveniently disable loads or start the vehicle engine. In other implementations, the telematics unit automatically disables some or all loads or turns on the engine, and may or may not notify the user that such actions were automatically performed.

The threshold (e.g., in terms of voltage) at which the battery charge monitor or the telematics unit determines that low charge has been detected at stage 203 is configurable. In an implementation, the threshold (or thresholds) at which the telematics unit determines that low charge has been detected is a configurable variable stored at the telematics unit, battery charge controller, or other battery charge monitoring device. When the vehicle is assembled, the threshold (or thresholds) are programmed into the vehicle, and may be changed later on by vehicle dealerships, the call center, and/or the customer (e.g., by configuration using a diagnostic tool or by reprogramming via a network). Allowing the threshold (or thresholds) to be programmable provides the customer and vehicle manufacturer/seller with flexibility as to the timing and frequency at which procedures pertaining to low battery charge are triggered.

With respect to notifying the user that the battery charge is low at stage 204, notification is performed in a number of different ways in various implementations. In one implementation, the user is notified that the battery charge is low through a human-machine interface (HMI) of the vehicle, e.g., through a displayed message on an in-vehicle display, an audio message played through vehicle speakers, and/or other vehicle alerts (e.g., providing a beeping noise and/or lighted notification on the dashboard). The alert could also involve activating the vehicle's horn in the event that the user is outside the vehicle. For example, if the user chooses to use the vehicle in accessory mode and indicates through the vehicle HMI that the user will be outside the vehicle, the vehicle provides an external notification to the user that the battery is low by activating the horn in a preconfigured pattern and/or sending an audio or text message to the user's mobile phone.

In another implementation, the user is notified through a network. For example, the telematics unit sends a text message to a mobile device of the user (e.g., the user's mobile phone or other computing device). The telematics unit may also use other ways of communicating with the user through the NAD of the telematics unit, for example, through an e-mail or other message sent through the internet, or by calling the user's mobile phone and playing an automated audio message.

Once the user is notified that the vehicle battery is at a low charge level, the user can then take appropriate actions, such as manually disabling certain loads or turning the vehicle engine on to charge the vehicle battery.

With respect to disabling some or all loads at stage 205, the telematics unit (or a battery charge controller) responds to detecting a low charge at stage 203 by disabling loads that are draining the vehicle battery. In one implementation, all loads (except for those involved in starting the vehicle engine and/or those related to emergency services) are turned off or disconnected upon detection of low charge to ensure that enough charge remains in the battery to start the engine.

Figure 3:
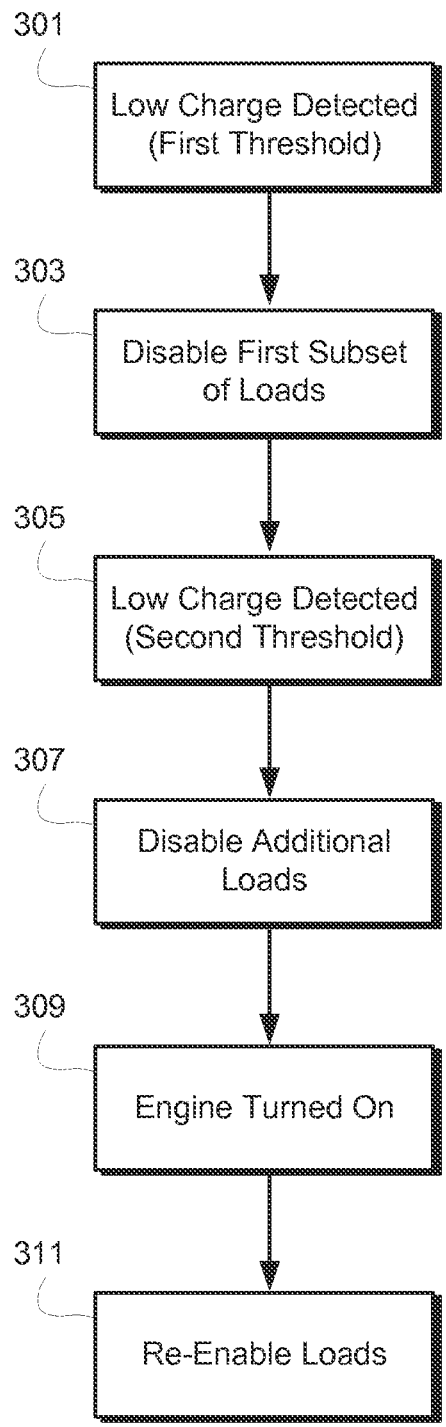
FIG. 3 is a flowchart illustrating a tiered process for disabling loads according to an implementation of the present invention.

In another implementation, multiple charge thresholds are used as depicted in the process 300 of FIG. 3. At stage 301, low charge is detected with respect to a first threshold, and in response, a subset of loads draining the vehicle battery is disabled. For example, infotainment services and related functionality such as the in-vehicle display and GNSS navigation unit are disabled first, while higher priority services and related functionality (such as emergency-related services) remain enabled. At stage 305, low charge is detected with respect to a second threshold that is lower than the first threshold, and at this point even the higher-priority loads are disabled (except the loads involved in starting the vehicle engine) to ensure that the vehicle battery is not drained to a point where the vehicle engine cannot be started. When the vehicle engine is turned on at a later point at stage 309, the configuration is reset such that the loads are re-enabled at stage 311.

It will be appreciated that in various embodiments, any number of thresholds may be used, with different services and vehicle functionality being separated into different levels of priority. For example, in one implementation, entertainment services are placed in the lowest priority class, information and navigation services are placed in a low priority class, certain vehicle functionality such as remote door unlocking and telecommunications capabilities are placed in a middle priority class, emergency services such as emergency calling and theft protection are placed in a high priority class, and vehicle battery monitoring functionality is placed in a highest priority class. Other implementations include variations in the classification of vehicle and telematics-related functionality, as well as variations as to the charge levels at which the corresponding thresholds are set.

With respect to turning the vehicle engine on at stage 206, the telematics unit (or other vehicle component controller) automatically turns the vehicle engine on in response to detecting that the vehicle charge is low. In certain implementations using multiple low charge thresholds, turning the engine on is performed at the lowest charge threshold as a last resort to prevent the vehicle battery from becoming entirely drained.

Figure 4:
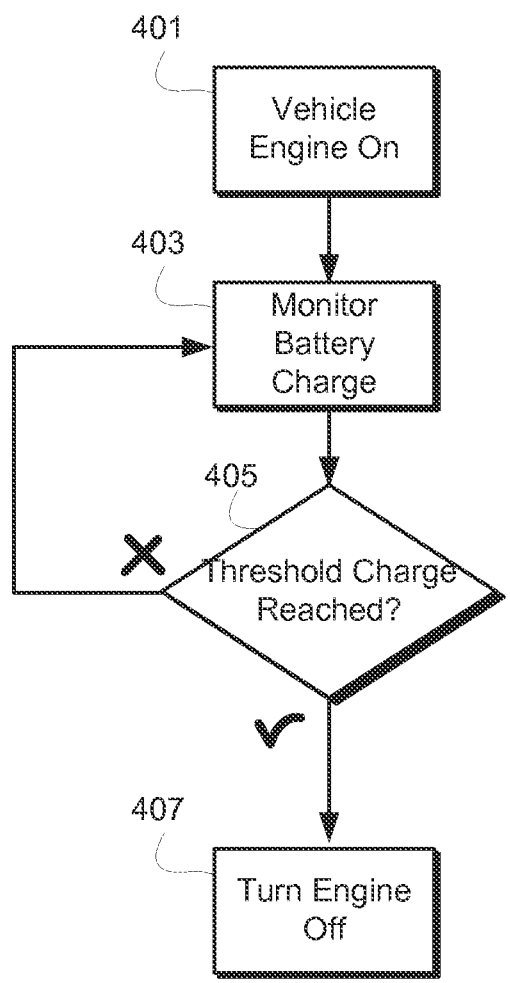
FIG. 4 is a flowchart illustrating a process for automatically turning the engine on and off to prevent complete battery drain according to an implementation of the present invention.

FIG. 4 depicts a process 400 for turning the vehicle engine for only a limited amount of time to avoid unnecessarily running the engine. At stage 401, the vehicle engine is turned on in response to low charge detection. At stage 403, the charge of the vehicle battery is monitored. At stage 405, if a threshold level of charge is reached (e.g., a level of charge that is sufficient to allow a reasonable amount of usage of telematics services and vehicle functionality), the vehicle engine is turned off and the vehicle is returned to accessory mode or off mode at stage 407. While the threshold voltage is not reached at stage 405, the battery charge continues to be monitored at stage 403. Alternatively, rather than using a threshold level of charge to determine when to turn off the engine at stage 407, the vehicle engine could be turned off according to a preconfigured timer.

It will thus be appreciated that the described system and method allows for detection of low battery charge and prevents a vehicle battery from becoming completely drained. Because users will be alerted as to low battery charge, users will achieve better fuel economy (and benefit the environment) from avoiding wasteful operation of the vehicle engine, as well as having peace of mind while using their telematics services and other vehicle functionality when the vehicle engine is off. Further, users will reduce the risk of having a dead battery and avoid the corresponding cost and inconvenience of needing roadside assistance. It will also be appreciated that the foregoing methods and implementations are merely examples of the inventive principles, and that these illustrate only preferred techniques.

It is thus contemplated that other implementations of the invention may differ in detail from foregoing examples. As such, all references to the invention are intended to reference the particular example of the invention being discussed at that point in the description and are not intended to imply any limitation as to the scope of the invention more generally. All language of distinction and disparagement with respect to certain features is intended to indicate a lack of preference for those features, but not to exclude such from the scope of the invention entirely unless otherwise indicated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for preventing discharge of a vehicle battery of a telematics-equipped vehicle, the method comprising:

monitoring the charge of the vehicle battery;
first determining, by a telematics unit while a vehicle engine is off, that charge of the vehicle battery has reached a first low battery charge threshold;
first disabling, by the telematics unit in response to the first determining, at least a first load draining the vehicle battery;
second determining, by the telematics unit while the vehicle engine is off, after the first determining, that the charge of the vehicle battery has reached a second low battery charge threshold; and
second disabling, by the telematics unit in response to the second determining, at least a second load draining the vehicle battery wherein the first load is of lower priority than the second load.

2. The method of claim 1, further comprising:
providing, by the telematics unit in response to the first determining, a notification that the vehicle battery has low charge;
wherein the notification is issued by the telematics unit via a cellular network to a telematics subscriber.

3. The method of claim 1, further comprising:
providing, by the telematics unit in response to the first determining, a notification that the vehicle battery has low charge;
wherein the notification is presented to a vehicle occupant via a human-machine interface (HMI) of the telematics-equipped vehicle.

4. The method of claim 1, further comprising:
providing, in response to the first determining or the second determining, an option to a telematics subscriber to turn on the vehicle engine;
receiving a direction from the telematics subscriber to turn on the vehicle engine; and
turning the vehicle engine on.

5. A non-transitory computer-readable medium having processor-executable instructions stored thereon for preventing discharge of a vehicle battery of a telematics-equipped vehicle, the processor-executable instructions, when executed by a processor, facilitate: monitoring the charge of the vehicle battery;
first determining, while a vehicle engine is off, that charge of the vehicle battery has reached a first low battery charge threshold;
first disabling, in response to the first determining, at least a first load draining the vehicle battery;
second determining, while the vehicle engine is off, after the first determining, that the charge of the vehicle battery has reached a second low batter,/charge threshold; and
second disabling, in response to the second determining, at least a second load draining the vehicle batter;
wherein the first load is of lower priority than the second load.

6. The non-transitory computer-readable medium of claim 5, wherein the processor-executable instructions, when executed, further facilitate:
providing, in response to the first determining, a notification that the vehicle battery has low charge;
wherein the notification is issued by a telematics unit of the telematics-equipped vehicle provided via a cellular network to a telematics subscriber.

7. The non-transitory computer-readable medium of claim 5, wherein the processor-executable instructions, when executed, further facilitate:
providing, in response to the first determining, a notification to that the vehicle battery has low charge;
wherein the notification is presented to a vehicle occupant via a human-machine interface (HMI) of the telematics-equipped vehicle.

8. The non-transitory computer-readable medium of claim 5, wherein the processor-executable instructions, when executed, further facilitate:
providing, in response to the first determining or the second determining, an option to the-a telematics subscriber to turn on the vehicle engine;
receiving a direction from the telematics subscriber to turn on the vehicle engine; and
turning the vehicle engine on.

9. The method of claim 1, further comprising:
third determining, by the telematics unit after the second determining, that the vehicle engine is turned on; and
enabling, by the telematics unit in response to the third determining, both the first load and the second load.

10. The method of claim 1, wherein the first load includes at least one of the group consisting of: an infotainment service an in-vehicle display, and a navigation unit; and
wherein the second load includes an emergency-related service.

11. The non-transitory computer-readable medium of claim 5, wherein the steps further comprise:
third determining, after the second determining, that the vehicle engine is turned on; and
enabling, in response to the third determining, both the first load and the second load.

12. The non-transitory computer-readable medium of claim 5, wherein the first load includes at least one of the group consisting of: an infotainment service an in-vehicle display, and a navigation unit; and
wherein the at least one relatively higher priority load includes an emergency-related service.

* * * * *